(12) United States Patent
Moore

(10) Patent No.: US 6,774,418 B2
(45) Date of Patent: *Aug. 10, 2004

(54) LOW DIELECTRIC SILICON OXYNITRIDE SPACER FILMS AND DEVICES INCORPORATING SUCH FILMS

(75) Inventor: John T. Moore, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/303,779

(22) Filed: Nov. 25, 2002

(65) Prior Publication Data

US 2003/0085436 A1 May 8, 2003

Related U.S. Application Data

(63) Continuation of application No. 09/507,463, filed on Feb. 22, 2000, now Pat. No. 6,518,626.

(51) Int. Cl.[7] .................. H01L 27/108; H01L 29/76; H01L 29/94; H01L 31/119; H01L 31/062
(52) U.S. Cl. .................. 257/288; 257/336; 257/344; 257/351; 257/411
(58) Field of Search .................. 438/756, 789, 438/790, 794, 197; 257/288, 296, 336, 344, 351, 411

(56) References Cited

U.S. PATENT DOCUMENTS

| 4,282,270 | A | | 8/1981 | Nozaki et al. | |
|---|---|---|---|---|---|
| 4,725,560 | A | | 2/1988 | Abernathey et al. | |
| 4,897,319 | A | | 1/1990 | Sun | |
| 5,322,825 | A | | 6/1994 | Leung et al. | |
| 5,621,681 | A | | 4/1997 | Moon | |
| 6,156,598 | A | | 12/2000 | Zhou et al. | |
| 6,518,626 | B1 | * | 2/2003 | Moore | 257/344 |
| 6,579,784 | B1 | * | 6/2003 | Huang | 438/595 |

FOREIGN PATENT DOCUMENTS

JP 04-260637 * 9/1992 .......... C03C/17/22

* cited by examiner

Primary Examiner—W. David Coleman
Assistant Examiner—William M. Brewster
(74) Attorney, Agent, or Firm—Dickstein Shapiro Morin & Oshinsky LLP

(57) ABSTRACT

A method of depositing a silicon oxynitride spacer film on a gate stack in a semiconductor device involves contacting the gate stack with bistertiarybutylaminosilane (BTBAS), at least one nitrogen containing compound and oxygen ($O_2$). The deposition is controlled to provide a wet etch rate for the deposited spacer film that is within the range of about 25 Angstroms per minute to less than or equal to about 1 Angstrom.

19 Claims, 5 Drawing Sheets

LOW DIELECTRIC SILICON OXYNITRIDE SPACER FILMS AND DEVICES INCORPORATING SUCH FILMS

This application is a continuation of U.S. patent application Ser. No. 09/507,463 filed Feb. 22, 2000, now U.S. Pat. No. 6,518,626, the entirety of which is hereby incorporated by reference herein.

FIELD OF THE INVENTION

The invention relates to a novel method of depositing a spacer film on a gate stack array in a semiconductor device. The invention also relates to a new spacer film for use in integrated circuits, and in particular, to spacer films with excellent resistivity to dry etchants and enhanced selectivity to wet etchants.

BACKGROUND OF THE INVENTION

Referring to FIG. 1, there is shown a portion of an integrated circuit wafer 10 in an intermediate stage of DRAM fabrication. The integrated circuit wafer section 10 has a substrate 12 formed of a material such as silicon. Formed in and on the substrate 12 are field oxide regions 14 and transistor gate stacks 16. The gate stacks 16 have a spacer film 17 deposited thereon. Also shown in FIG. 1 are the active or doped regions 18 in the substrate 12. A first layer of insulating material 20, which is usually a type of glass oxide well known in the art, which for example, may comprise Boro-Phospho-Silicate Glass (BPSG) is also formed over the substrate and gate stacks 16. The first layer of insulating material 20 may, in actuality, be formed as one or more layers of insulating material of, for example, BPSG. Also shown in FIG. 1 is a second layer of insulating material 22 deposited over the first layer 22. Contact openings 24 are then formed through the insulative layers 20, 22 down to the doped regions 18. Openings 24 are formed using a patterned photoresist mask (not shown) which defines locations or areas to be etched, i.e. the openings. To form the contact opening, an etchant is applied to the insulating layers 20, 22. Dry etching techniques known in the art for performing a self-aligned contact (SAC) etching, are typically utilized for this purpose. Freon-containing gases, for example, are applied to the surface of the insulating layer 22 to form the opening 24. A non-exhaustive listing of such gases includes such as fluorinated hydrocarbons as $CH_2F_2$, $CHF_3$, $C_2F_6$, $C_2HF_5$, and $CH_3F$. The spacer film 17 protects the sides of the gate stacks 16 during the SAC dry etching process. After etching, the photoresist layer is removed. The dry etching step often leaves behind a layer of etch residue 26 in the contact opening 24, usually at the bottom and sides thereof. This etch residue is often comprised of a material such as a hydrocarbon polymer or residual silicon dioxide. The etch residue can interfere with the connection between the doped region 18 and a subsequently deposited conductive polyplug (not shown) in the contact opening 24.

To remove the etch residue 26 formed in the contact opening 24, a cleaning step is performed. This cleaning step is typically a wet etch process in which dilute acid material, preferably dilute fluorine-containing compounds such as dilute hydrofluoric acid (HF) or HF:TMAH (trimethylaluminum hydroxide), for example, are utilized to remove the etch residue 26. Desirably, the etch residue should be removed without eroding the spacer film 17 or the contact opening 24. The spacer film 17 protects the gate stack 16 from contact with a conductive polyplug, which is deposited within opening 24 and which is usually formed of a material such as doped polysilicon.

Silicon oxynitrides are desirable as the spacer film 17 since they typically form a lower stress film and have a lower dielectric constant than oxygen-free silicon nitride. Silicon oxynitrides have also demonstrated better barrier properties to dopant diffusion than pure silicon oxides. One of the drawbacks of using silicon oxynitride, however, is the wet etch rate of the material in dilute hydrofluoric (HF) acid and other fluorine-containing compounds which may be used in the aforementioned contact residue cleaning step. With silicon dioxide, the wet etch rate is very often too high causing erosion of the spacer film 17 by the etchant material as the etch residue, or polymer/residual silicon dioxide layer, is removed by the etchant. In certain instances, the etch rate of the spacer film can be as great as two times (2×) the etch rate for the polymer residue layer. It is desirable to have a spacer film that is resistant to etching so that the contact opening 24, and in particular the bottom surface thereof, can be cleaned with a material such as dilute HF or HF:TMAH etch while not eroding the spacer film 17. It is also desirable to have a spacer film that can be partially etched, if need be, to provide a more robust conductive plug contact with the substrate 12.

What is therefore needed in the art is a new method of forming a more robust and selective spacer film. What is also needed is a new spacer film which exhibits excellent resistivity to the dry etchants used to form contact openings, and which also exhibits lower etch rates in wet etchants than other spacer films currently available in the art.

SUMMARY OF THE INVENTION

The invention provides a method of depositing a silicon oxynitride spacer film on a gate stack in a semiconductor device. The method involves depositing an oxynitride layer on the gate stack by contacting the gate stack with bister-tiarybutylaminosilane (BTBAS), at least one nitrogen-containing compound and oxygen ($O_2$) to form the silicon oxynitride spacer film. The stoicheometry and other parameters are controlled to provide a selective wet etch rate for the deposited spacer film that is within the range of about 25 Angstroms per minute to less than or equal to about 1 Angstrom/minute. In a preferred embodiment of the invention, there is silicon carbide incorporation in the spacer film for improved dry etch (SAC) resistance.

The invention further provides a silicon oxynitride spacer film useful for protecting a gate stack in a semiconductor device. The spacer film has a wet etch rate within the range of about 25 Angstroms/minute to less than or equal to about 1 Angstrom/minute. The spacer film furthermore exhibits a high refractive index and a low dielectric constant.

Also provided as part of the invention is a semiconductor device with at least one gate stack, and a spacer film deposited over the gate stack. The spacer film has a wet etch rate in fluorine-containing wet etchants within the range of about 25 Angstroms/minute to less than or equal to about 1 Angstrom/minute.

In still another aspect of the invention, there is provided an integrated circuit having a substrate with at least one gate stack formed thereon. A spacer film deposited on at least the sides of the gate stack has a wet etch rate in fluorine-containing wet etchant compounds within the range of about 25 Angstroms/minute to less than or equal to about 1 Angstrom/minute.

Also provided is a memory device having a memory cell containing an access transistor. The transistor includes a gate stack and a spacer film deposited on at least the sides of the gate stack. The spacer film has a wet etch rate in fluorine-containing wet etchant compounds within the range of about 25 Angstroms/minute to less than or equal to about 1 Angstrom/minute.

Additional advantages and features of the present invention will become more readily apparent from the following detailed description and drawings which illustrate various embodiments of the invention.

DETAILED DESCRIPTION OF THE PREFERRED EMBODIMENTS

Figure 1:
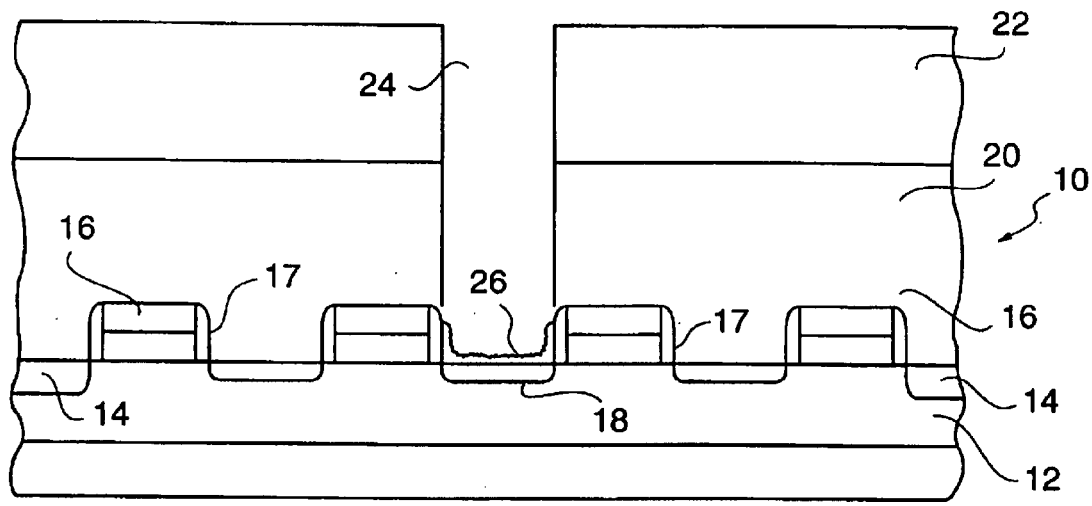
FIG. 1 is a cross sectional view of a prior art semiconductor device at an immediate stage of fabrication.

The invention in one aspect is directed to a novel method of forming a silicon oxynitride spacer film on gate stacks in a semiconductor wafer device. The spacer film formed from the process hereinafter described adequately protects a gate stack during a SAC etch and also exhibits enhanced selectivity to wet etching used for cleaning a SAC contact opening. As that term is used herein, "enhanced selectivity to wet etching" means that the spacer film exhibits an etch rate within the range of about 25 Angstroms/minute to less than or equal to about 1 Angstrom/minute in many typical "wet" etchants available in the semiconductor industry, e.g. fluorine-based wet etchants such as HF and HF-TMAH, which are used to clean contact vias or openings of residue such as silicon dioxide and other debris such as polymer residue. At the same time, the spacer film maintains excellent resistivity to the many types of dry etchants, e.g. freon-containing compounds (fluorinated hydrocarbons), used in self-aligned contact (SAC) etching to form the contact openings.

Reference herein shall also be made to the terms "wafer" and "substrate", which are to be understood as including a silicon base, silicon-oninsulator (SOI) or silicon-on-sapphire (SOS) structures, doped and undoped semiconductors, epitaxial layers of silicon supported by a base semiconductor foundation, and other semiconductor structures. In addition, when reference is made to a "wafer" or "substrate" in the following description, previous process steps may have been utilized to form arrays, regions or junctions in or on the base semiconductor structure or foundation. In addition, the semiconductor need not be silicon-based, but could be based on silicon-germanium germanium or gallium arsenide.

According to the process of the invention, deposition of the silicon oxynitride spacer film typically occurs in an industrial scale device which has been adapted for such use. Preferably, this device will be what is known in the art as a batch furnace. However, other apparatus which can provide the spacer film having the characteristics hereinafter set forth may also be used. It should be noted that the foregoing description illustrates the formation of a spacer film on the gate stack of an access transistor of a memory cell, however, the invention can be used to protect a gate stack of any type of transistor device employed in any type of integrated circuit.

The process of depositing the spacer film is broadly described as a low temperature and low pressure operation. The operating temperature of the batch furnace will be within the range of about 350 to about 700° C., more preferably about 450 to about 650° C. More desirably, the method of the invention will be performed at a temperature of about 500 to about 650° C. Operating pressure is typically within the range of about 100 to about 1000 milliTorr. In a preferred embodiment, the pressure is within the range of about 250 to about 800 milliTorr.

To form the silicon oxynitride spacer film, gaseous bis-tertiarybutylaminosilane (BTBAS) is introduced as part of the deposition mixture onto the gate stack region. BTBAS provides the silicon component of the silicon oxynitride spacer film. The BTBAS flow rate will be within the range of about 50 to about 300 SCCM/minute, and more preferably will be about 100 to about 200 SCCM/minute.

Along with the BTBAS, other gaseous materials are provided in the deposition mixture to form the spacer film. One or more nitrogen-containing compounds are provided to react with the BTBAS. These nitrogen-containing compound(s) provide the "nitride" component of the silicon oxynitride spacer film. The nitrogen-containing compound(s) may be derived from any industry source, and can include one or more of the following compounds: ammonia ($NH_3$), nitrous oxide ($N_2O$), nitric oxide (NO) and nitrogen ($N_2$). Of these, a gaseous mixture containing at least one of ammonia, nitrous oxide and nitric oxide is preferred, with a mixture containing at least two of these three being more preferred, and a gaseous mixture containing a combination of all three being particularly preferred.

The flow rate for the nitrous oxide will be within the range of about 100 to about 1500 SCCM/minute, and more desirably will be within the range of about 250 to about 1250 SCCM/minute. The flow rate for the nitric oxide will be within the range of about 25 to about 250 SCCM/minute. In a preferred embodiment, the flow rate for the nitric oxide will be about 50 to about 200 SCCM/minute. The flow rate for ammonia will be within the range of about-50 to about 1000 SCCM/minute, with about 250 to about 750 SCCM/minute being more preferred.

Another component of the spacer film is oxygen ($O_2$). The flow rate for oxygen will be within the range of about 15 to about 100 SCCM/minute. More preferably, the oxygen will be introduced at a flow rate of about 30 to about 75 SCCM/minute.

In a further embodiment of the process of the invention, carbon is incorporated into the resultant spacer film. The carbon is provided from the "tertiarybutyl" component of the BTBAS. The carbon becomes bound in the spacer film primarily as silicon carbide (SiC), and to a lesser extent as carbon nitride ($C_3N_4$). It has been now discovered that as the percentage of carbon in the spacer film is increased, the wet etch rate for the spacer film is decreased significantly. It is preferred that the carbon incorporation in the spacer film be within the range of about 5 to about 25% by weight, with an amount of about 20% by weight or greater being more desirable (all percentages herein are by weight, unless otherwise specified). Carbon incorporation may be maximized by increasing the flow rate of the BTBAS within the amounts heretofore set forth. Moreover, by increasing the operating temperatures within the ranges already set forth during the spacer film deposition, it is possible to reduce the amount of silicon carbide incorporated. Conversely, lowering the temperature usually results in an increase in silicon carbide incorporation.

In yet another embodiment of the invention, the ratios of the flow rates of the gases used in depositing the spacer film are adjusted so as to provide a spacer film having a wet etch rate within the range of about 25 Angstroms/minute to less than or equal to about 1 Angstrom/minute. In particular, the ratio of the flow rate of nitrous oxide to the flow rate of oxygen is adjusted to be within the range of about 0.5:1 to about 4:1. It has now been further discovered that as the ratio of the flow rates of nitrous oxide to oxygen is increased, the wet etch rate of the resultant spacer film in certain types of fluorine-containing wet etchants is decreased. The wet etch rate may be tailored from about 25 Angstroms/minute when the $N_2O/O_2$ ratio is about 0.5:1 to less than or equal to about 1 Angstrom/minute when the same ratio is about 4:1 or greater.

The silicon oxynitride spacer film formed according to the process herein described is within the range of about 200 to about 850 Angstroms in thickness. More preferably, the spacer film will be within the range of about 400 to about 600 Angstroms in thickness.

Silicon will comprise about 35 to about 45% by weight of the silicon oxynitride spacer film. More preferably, silicon will comprise about 37.5% to about 42.5% by weight of the spacer film. Nitrogen will comprise about 20 to about 30% by weight of the spacer film, with a range of about 22 to about 28% being more preferred. Oxygen will make up about 10 to about 25% by weight of the spacer film, with amounts in the range of about 15 to about 20% being preferred. As heretofore set forth, carbon will also preferably be included in the spacer film, primarily as bound silicon carbide. The quantity of carbon in the spacer film will be within the range of about 5 to about 25% by weight, with an amount in excess of about 10% being more preferred, and greater than about 20% being even more desirable.

The silicon oxynitride spacer film will have a relatively high refractive index within a relatively narrow range of about 1.55 to about 1.72. The dielectric constant will be within the range of about 4.5 to about 5.6. Thus, the spacer film formed according to the process herein described will be highly suitable in most spacer applications. As heretofore set forth, spacer film deposition conditions can be tailored to give selective etch rates in certain wet etchants, e.g. HF, from about 25 Angstroms/minute to less than about 1 Angstrom/minute. To obtain similar etch characteristics with a standard oxygen-free silicon nitride film, the dielectric constant would have to be much higher, thus capacitance coupling would also be higher.

Figure 2:
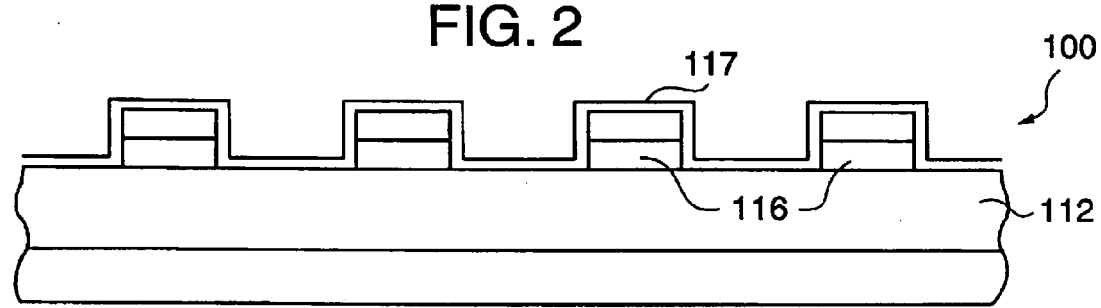
FIG. 2 is a cross sectional view of another semiconductor device at an intermediate stage of fabrication and illustrating the process of the invention.
Figure 3:
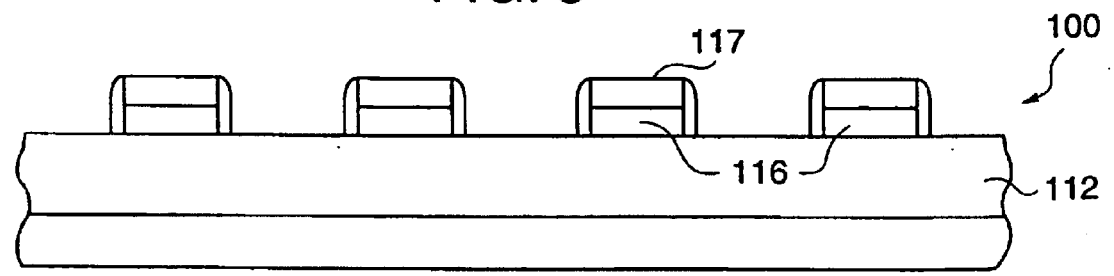
FIG. 3 is a cross sectional view of the semiconductor device of FIG. 2 at a later stage of fabrication.

Referring again to the drawings, FIGS. 2 and 3 illustrate the process of the invention as applied to gate stacks of access transistors used in a memory cell of, for example, a DRAM. In FIG. 2, a spacer film 117 has been deposited on the array of gate stacks 116 present on the substrate 112 of the semiconductor device 100. In FIG. 3, the excess spacer film material 117 in contact with the substrate 112 has been removed according to methods known in the art. The gate stacks 116 are shown with the spacer film 117 thereover. The spacer film 117 will protect the gate stacks from subsequent SAC etching used to form the contact openings, as heretofore described. Thereafter, the spacer film will be resistant to the wet etchants used to clean the contact openings or vias of SAC etch residue.

Figure 4:
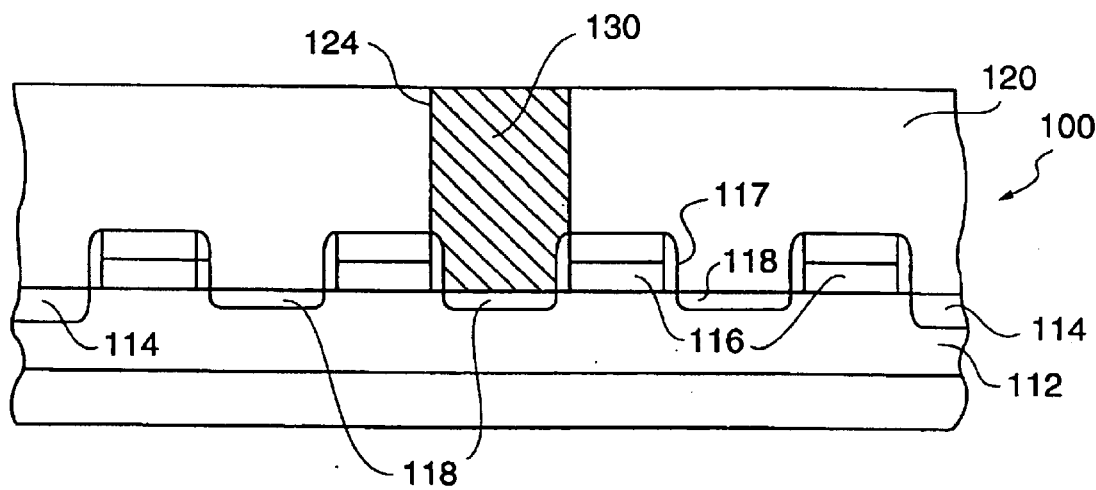
FIG. 4 is a cross sectional view of the semiconductor device of FIG. 3 at a later stage of fabrication.

FIG. 4 shows the semiconductor device 100 at a later stage of fabrication in which substrate 112 contains doped active regions 118 and field oxide regions 114. A layer of insulating material 120, e.g. BPSG, overlays the device through which a contact opening 124 has been etched. The contact opening 124 is provided with a conductive plug 130. The spacer film 117 of the invention is not etched during formation of opening 124, and is also not eroded during an etch wash of any residue remaining at the bottom and sides of the etched opening. The spacer film 117 also protects the gate stack array 116 from contact with the conductive plug 130. The gate stack array 116 and the spacer film 117 shown in FIG. 4 can be part of an access transistor in a memory cell of a memory device.

Figure 4A:
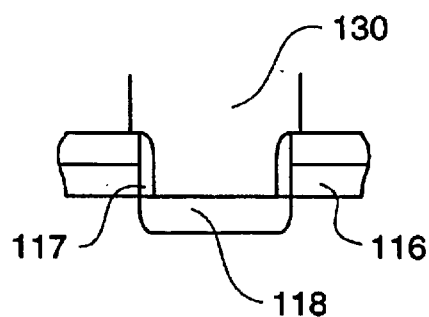
FIGS. 4A and 4B are close up views of the semiconductor device of FIG. 4 according to two embodiments of the invention.
Figure 4B:
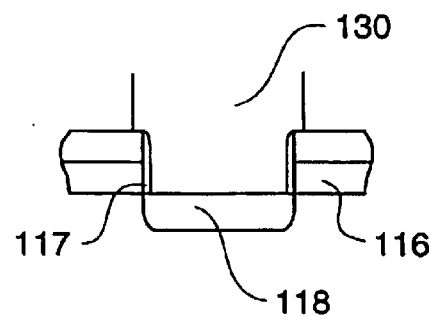

Referring now to FIGS. 4A and 4B, there is shown a close-up of the gate stacks 116 presented in FIG. 4 according to two embodiments of the invention. In a first embodiment, the novel process and spacer film herein set forth is provided such that the etch rate of the spacer film 117 is very low to provide minimal or no wet etching of the spacer film as shown in FIG. 4A. In another embodiment shown in FIG. 4B, the wet etch rate of the spacer film 117 is such that wet etchants can etch some portion of the spacer film so as to provide a "pulled back" spacer film 117. In this embodiment, a more robust conductive plug 130 contact with the substrate 112 is often attained. The embodiments shown in FIGS. 4A and 4B can be alternately attained by adjusting the stoicheometry and other process parameters as heretofore set forth. Thus, it is possible to obtain a spacer film that is highly resistant to wet etchants, and yet still exhibits a certain selectivity relative thereto.

Figure 5:
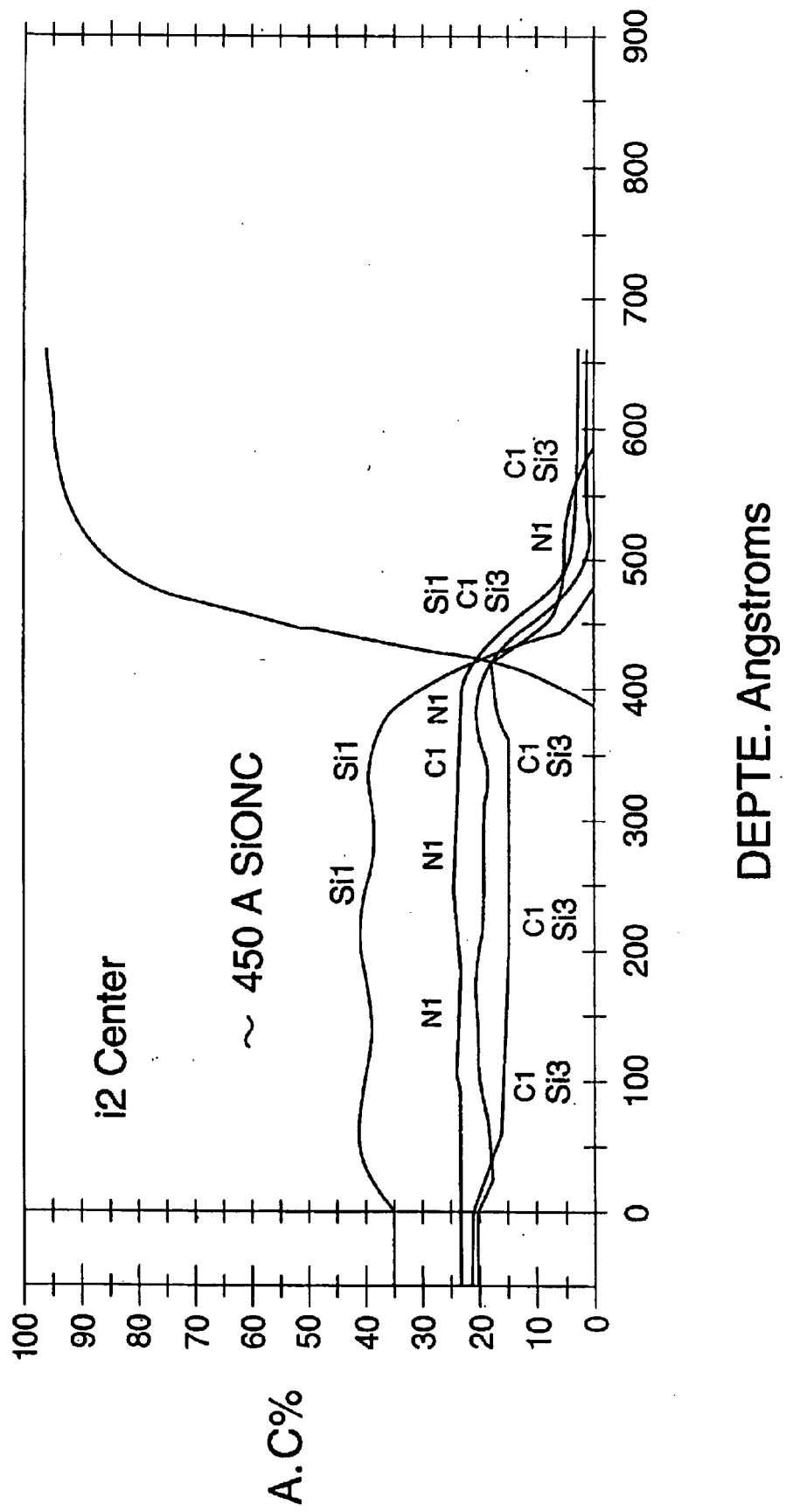
FIG. 5 is a graph of the depth profile of a spacer film which has been deposited according to the process of the invention.

FIG. 5 is a graph of the depth profile of a spacer film which has been deposited according to the method of the invention. As shown therein, the stoichiometric quantities of the elements silicon, nitrogen, oxygen and carbon are substantially uniform throughout the depth, indicating successful deposition of the spacer film.

Figure 6:
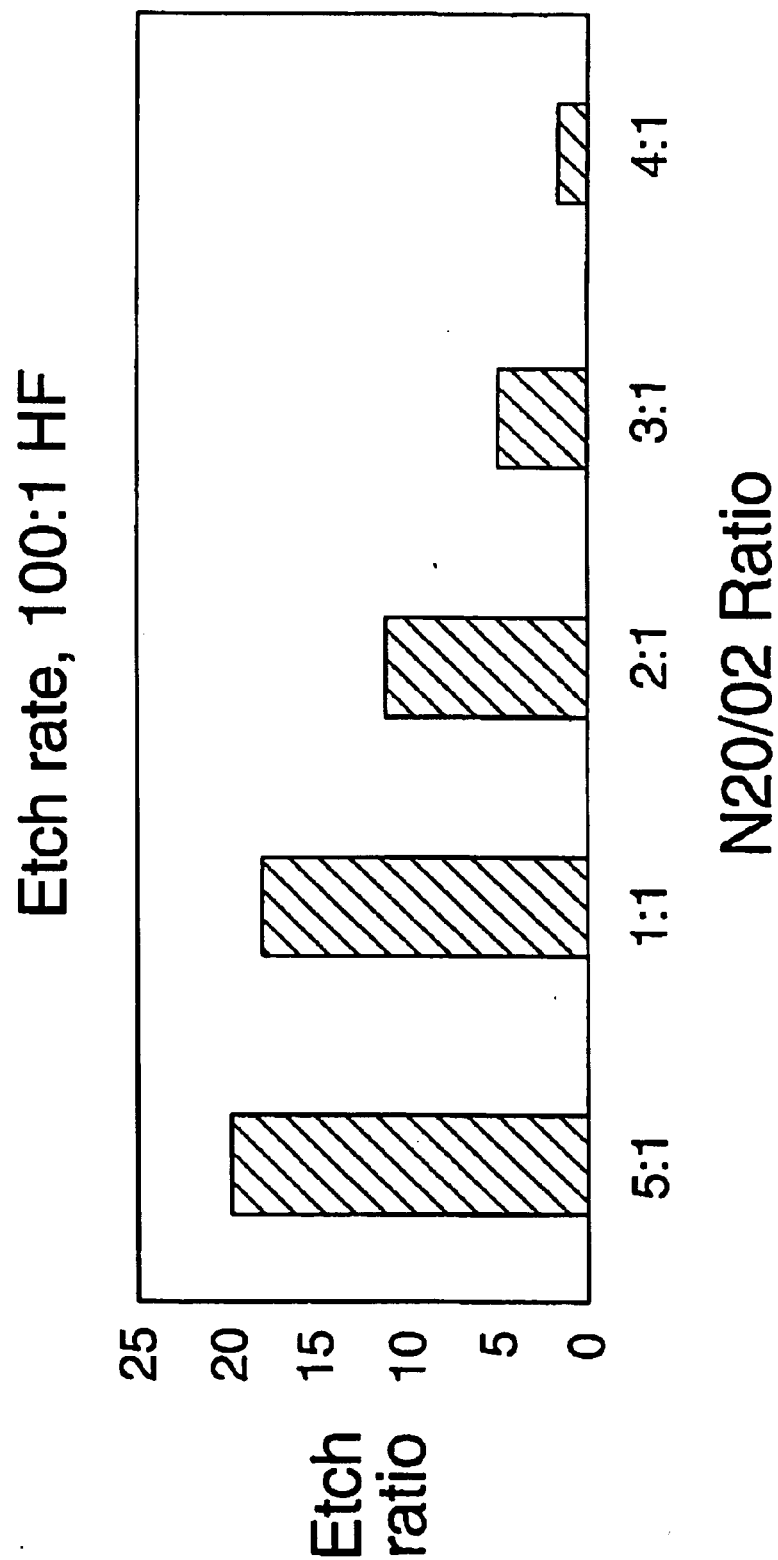
FIG. 6 is a graph comparing spacer film etch rates for various flow rate deposition ratios.

FIG. 6 is a graph comparing etch rates in a 100:1 HF solution for several spacer films of the invention which were prepared using various $N_2O/O_2$ flow rate deposition ratios. As FIG. 6 shows, the etch rate decreases as the flow rate ratio of nitrous oxide to oxygen is increased. This indicates that the etch rate of the deposited spacer film may be tailored by adjusting the flow rate ratio of nitrous oxide and oxygen during deposition.

Figure 7:
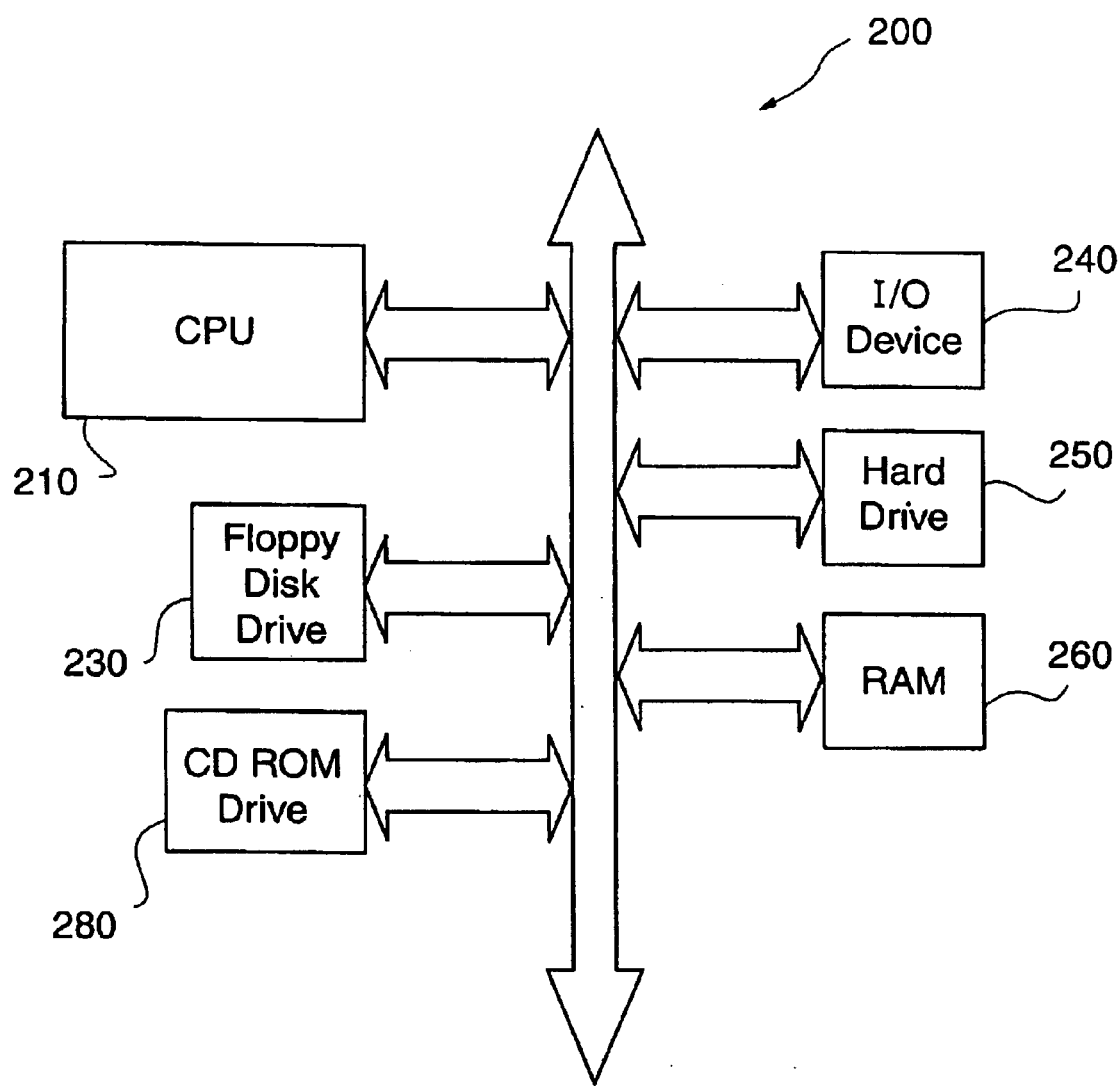
FIG. 7 is a block diagram of a typical processor based system which includes integrated circuits that utilize the spacer film of the present invention.

A typical processor based system which includes integrated circuits that utilize the spacer film formed in accordance with the present invention is illustrated generally at 200 in FIG. 7. A processor based system, such as a computer system, for example, generally comprises a central processing unit (CPU) 210, for example, a microprocessor, that communicates with one or more input/output (I/O) devices 240, and a hard drive 250 over a bus system 270 which may include one or more busses and/or bus bridges. The computer system 200 also includes a hard disk drive 220, a floppy disk drive 230, a random access memory (RAM) 260, a read only memory (ROM) 280 and, in the case of a computer system may include other peripheral devices such as a compact disk (CD) ROM drive 230 which also communicate with CPU 210 over the bus 270. While FIG. 7 shows one exemplary computer system architecture, many others are also possible. One or more of the processor and integrated circuits which communicate with the processor such as memories 260, 280 may have gate stacks protected with the silicon oxynitride spacer film described and illustrated above The foregoing description is illustrative of exemplary embodiments which achieve the objects, features and advantages of the present invention. It should be apparent that many changes, modifications, substitutions may be made to the described embodiments without departing from the spirit or scope of the invention. The invention is not to be considered as limited by the foregoing description or embodiments, but is only limited by the scope of the appended claims.

What is claimed as new and desired to be protected by Letters Patent of the United States is:

1. A silicon oxynitride spacer film comprising silicon in an amount of about 37.5% to about 42.5% by weight; nitrogen in an amount of about 22% to about 28% by weight, oxygen in an amount of about 15% to about 20% by weight, and carbon in an amount of greater than about 20% by weight.

2. The spacer thin of claim 1, wherein said nitrogen, oxygen, and carbon are present in percentages by weight suitable for said spacer film to exhibit enhanced selectivity to wet etching.

3. The spacer film of claim 2, said spacer film having a wet etch rate in fluorine-containing wet etchants within the range of about 25 Angstroms/minute to less than or equal to about 1 Angstrom/minute; a refractive index within the range of about 1.55 to about 1.72; and a dielectric constant within the range of about 4.5 to about 5.6.

4. The spacer film of claim 1, said spacer film being resistive to erosion by dry etchants.

5. The spacer film of claim 1, wherein the percentages by weight of said silicon, nitrogen, oxygen, and carbon are substantially uniform throughout said spacer film.

6. The spacer film of claim 1, wherein said spacer film is within the range of about 200 to about 850 Angstroms in thickness.

7. The spacer film of claim 6, wherein said spacer film is within the range of about 400 to about 600 Angstroms in thickness.

8. The spacer film of claim 1, wherein said spacer film comprises said silicon, nitrogen, oxygen, carbon as silicon oxynitride, silicon carbide, and carbon nitride.

9. The spacer film of claim 1, wherein said spacer film has a refractive index within the range of about 1.55 to about 1.72.

10. The spacer film of claim 1, wherein said spacer film has a dielectric constant within the range of about 4.5 to about 5.6.

11. A semiconductor device comprising:

at least one gate stack; and a spacer film deposited over said gate stack said spacer film comprising silicon in an amount of about 37.5% to about 42.5% by weight, nitrogen in an amount of about 22% to about 28% by weight, oxygen in an amount of about 15 to about 20% by weight, and carbon in an amount of greater than about 20% by weight.

12. The device of claim 11, wherein said nitrogen, oxygen, and carbon are present in said spacer film in percentages by weight suitable far said spacer film to exhibit enhanced selectivity to wet etching.

13. The device of claim 12, wherein said spacer film has a wet etch rate in fluorine-containing wet etchants within the range of about 25 Angstroms/minute to less than or equal to about 1 Angstrom/minute; a refractive index within the range of about 1.55 to about 1.72: and a dielectric constant within the range of about 4.5 to about 5.6.

14. The device of claim 11, wherein said spacer film is resistive to erosion by dry etchants.

15. The device of claim 11, wherein the percentages by weight of said silicon, nitrogen, oxygen, and carbon are substantially uniform throughout said spacer film.

16. The device of claim 11, wherein said spacer film is within the range of about 200 to about 850 Angstroms in thickness.

17. The device of claim 16, wherein said spacer film is within the range of about 350 to about 500 Angstroms in thickness.

18. The device of claim 11, wherein said spacer film comprises said silicon, nitrogen, oxygen, carbon as silicon oxynitride, silicon carbide, and carbon nitride.

19. A memory device comprising a memory cell containing an access transistor, said transistor including a gate stack and a spacer film deposited on at least the sides of said gate stack said spacer film comprising silicon in an amount of about 37.5% to about 42.5% by weight, nitrogen in an amount of about 22% to about 28% by weight, oxygen in an amount of about 15 to about 20% by weight, and carbon in an amount of greater than about 20% by weight.

* * * * *

UNITED STATES PATENT AND TRADEMARK OFFICE
CERTIFICATE OF CORRECTION

PATENT NO. : 6,774,418 B2
DATED : August 10, 2004
INVENTOR(S) : John T. Moore

It is certified that error appears in the above-identified patent and that said Letters Patent is hereby corrected as shown below:

Column 1,
Line 45, "such as fluorinated" should read -- such fluorinated --.

Column 3,
Line 55, "silicon-oninsulator" should read -- silicon-on-insulator --.

Column 4,
Line 67, "5" should read -- 5% --.

Column 5,
Line 34, "20" should read -- 20% --.
Line 35, "22" should read -- 22% --.
Line 37, "10" should read -- 10% --.
Line 38, "15" should read -- 15% --.
Line 42, "5" should read -- 5% --.

Column 8,
Line 11, "15" should read -- 15% --.
Line 15, "far" should read -- for --.

Signed and Sealed this

Twenty-eighth Day of February, 2006

JON W. DUDAS
*Director of the United States Patent and Trademark Office*